(12) United States Patent
Inamasu

(10) Patent No.: US 11,804,466 B2
(45) Date of Patent: Oct. 31, 2023

(54) SUBSTRATE PROCESSING APPARATUS, SUBSTRATE PROCESSING METHOD AND BONDING METHOD

(71) Applicant: Tokyo Electron Limited, Tokyo (JP)

(72) Inventor: Toshifumi Inamasu, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 296 days.

(21) Appl. No.: 16/799,985

(22) Filed: Feb. 25, 2020

(65) Prior Publication Data

US 2020/0273835 A1  Aug. 27, 2020

(30) Foreign Application Priority Data

Feb. 27, 2019  (JP) .................................. 2019-034842

(51) Int. Cl.
*H01L 23/00* (2006.01)

(52) U.S. Cl.
CPC .............. *H01L 24/75* (2013.01); *H01L 24/83* (2013.01); *H01L 2224/7501* (2013.01); *H01L 2224/759* (2013.01); *H01L 2224/75744* (2013.01); *H01L 2224/83896* (2013.01)

(58) Field of Classification Search
None
See application file for complete search history.

(56) References Cited

U.S. PATENT DOCUMENTS

| | | | | |
|---|---|---|---|---|
| 2011/0232082 A1* | 9/2011 | Kim | ................. | H01L 21/67144 29/740 |
| 2015/0083786 A1* | 3/2015 | Okamoto | .......... | H01L 21/67092 228/9 |
| 2015/0096651 A1* | 4/2015 | Kojio | ..................... | H01L 24/81 148/23 |
| 2020/0144078 A1* | 5/2020 | Hsieh | ..................... | H01L 21/50 |

FOREIGN PATENT DOCUMENTS

| | | |
|---|---|---|
| JP | 2013-207160 A | 10/2013 |
| JP | 2015-095579 A | 5/2015 |

* cited by examiner

*Primary Examiner* — Steven M Christopher
(74) *Attorney, Agent, or Firm* — Pearne & Gordon LLP

(57) ABSTRACT

A substrate processing apparatus includes a chuck configured to attract and hold a substrate; an observer configured to observe multiple positions within a second surface of the substrate attracted to and held by the chuck, the second surface being opposite to a first surface thereof which is in contact with the chuck; and an analyzer configured to analyze observation results of the multiple positions. When a singularity regarding a height from a surface of the chuck attracting and holding the substrate exists on the second surface, the analyzer specifies a position of the singularity on the chuck.

10 Claims, 15 Drawing Sheets

SUBSTRATE PROCESSING APPARATUS, SUBSTRATE PROCESSING METHOD AND BONDING METHOD

CROSS-REFERENCE TO RELATED APPLICATION

This application claims the benefit of Japanese Patent Application No. 2019-034842 filed on Feb. 27, 2019, the entire disclosure of which is incorporated herein by reference.

TECHNICAL FIELD

The various aspects and embodiments described herein pertain generally to a substrate processing apparatus, a substrate processing method and a bonding method.

BACKGROUND

A bonding apparatus described in Patent Document 1 is equipped with an upper chuck configured to attract a substrate at an upper side from above it and a lower chuck configured to attract a substrate at a lower side from below it. While being held to face each other, the two substrates are bonded. To elaborate, the bonding apparatus brings a central portion of the upper substrate attracted by the upper chuck into contact with a central portion of the lower substrate attracted by the lower chuck by pressing down the central portion of the upper substrate. Accordingly, the central portions of the two substrates are bonded by an intermolecular force or the like. Then, the bonding apparatus expands a bonding region between the two substrates from the central portions of the substrates to peripheral portions thereof.

Patent Document 1: Japanese Patent Laid-open Publication No. 2015-095579

SUMMARY

In an exemplary embodiment, a substrate processing apparatus includes a chuck configured to attract and hold a substrate; an observer configured to observe multiple positions within a second surface of the substrate attracted to and held by the chuck, the second surface being opposite to a first surface thereof which is in contact with the chuck; and an analyzer configured to analyze observation results of the multiple positions. When a singularity regarding a height from a surface of the chuck attracting and holding the substrate exists on the second surface, the analyzer specifies a position of the singularity on the chuck.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
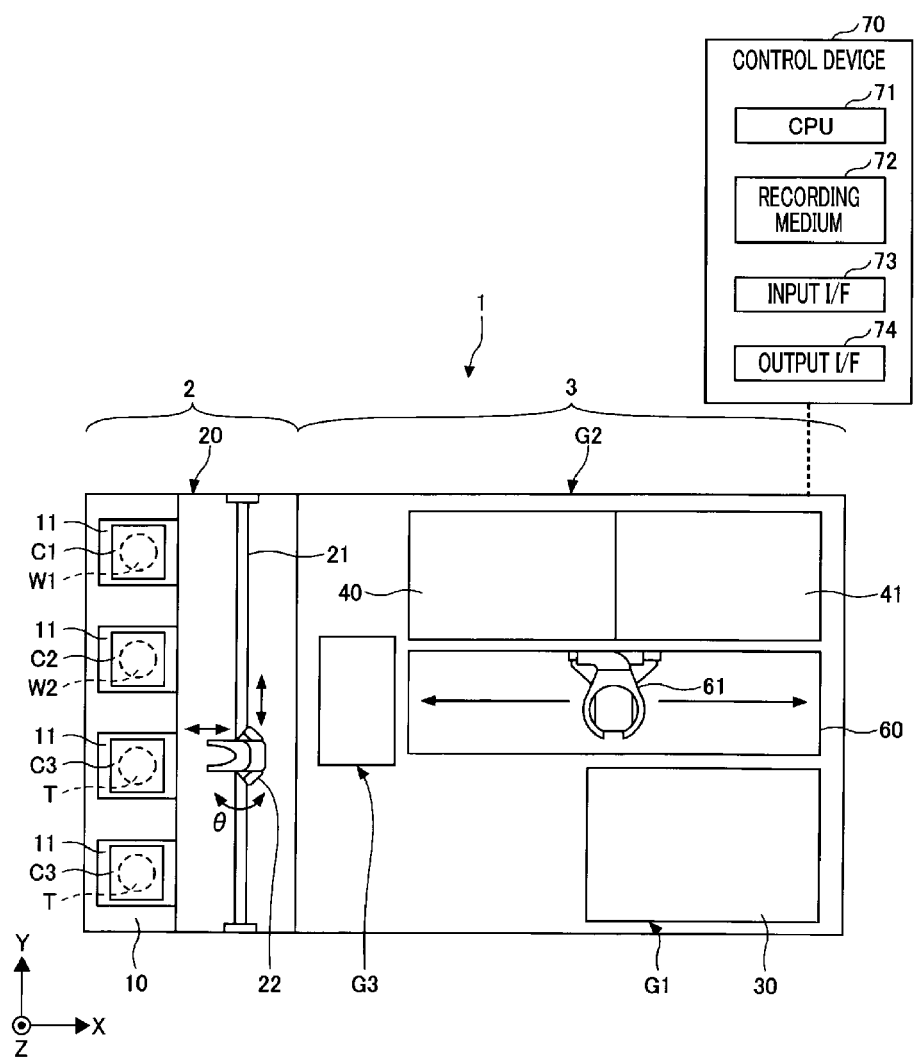
FIG. 1 is a plan view illustrating a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described in detail with reference to the accompanying drawings. In the various drawings, same or corresponding parts will be assigned same reference numerals, and redundant description may be omitted. In the following description, the X-axis direction, the Y-axis direction and the Z-axis direction are orthogonal to each other, and the X-axis and Y-axis directions are horizontal directions whereas the Z-axis direction is a vertical direction. A rotational direction around a vertical axis is also referred to as "θ direction." In the present specification, below means vertically below, and above means vertically above.

<Bonding System>

Figure 2:
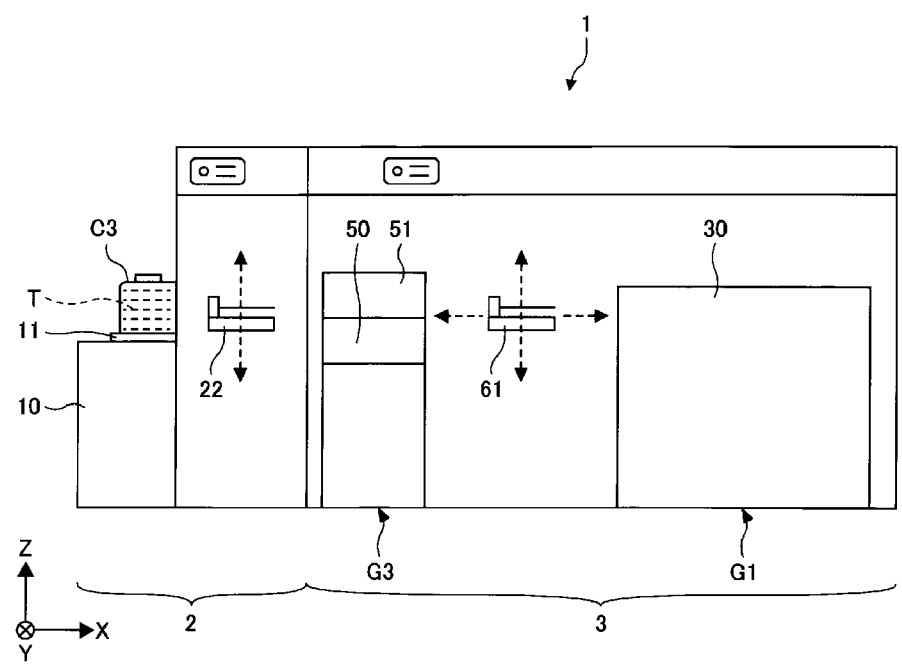
FIG. 2 is a side view illustrating the bonding system according to the exemplary embodiment.
Figure 3:
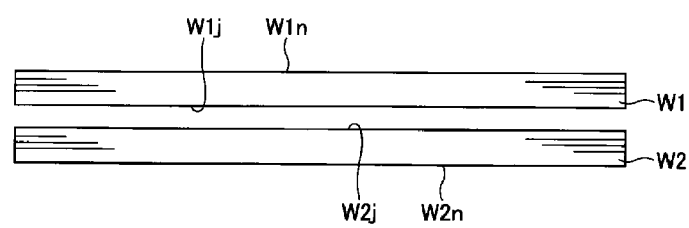
FIG. 3 is a side view illustrating a state before a first substrate and a second substrate are bonded according to the exemplary embodiment.

FIG. 1 is a plan view illustrating a bonding system 1 according to an exemplary embodiment. FIG. 2 is a side view illustrating the bonding system 1 according to the exemplary embodiment. FIG. 3 is a side view illustrating a state before a first substrate and a second substrate are bonded according to the exemplary embodiment. The bonding system 1 shown in FIG. 1 forms a combined substrate T (see FIG. 7B) by bonding a first substrate W1 and a second substrate W2.

The first substrate W1 is, for example, a semiconductor substrate such as a silicon wafer or a compound semiconductor wafer on which multiple electronic circuits are formed. The second substrate W2 is, for example, a bare wafer on which no electronic circuit is formed. The first substrate W1 and the second substrate W2 have the substantially same diameter. Further, the second substrate W2 may have an electronic circuit formed thereon.

In the following description, the first substrate W1 may sometimes be referred to as "upper wafer W1"; the second substrate W2, "lower wafer W2"; and the combined substrate T, "combined wafer T." Further, in the following description, as depicted in FIG. 3, among surfaces of the upper wafer W1, a surface to be bonded to the lower wafer W2 will be referred to as "bonding surface W1$j$", and a surface opposite to the bonding surface W1$j$ will be referred to as "non-bonding surface W1$n$". Further, among surfaces of the lower wafer W2, a surface to be bonded to the upper wafer W1 will be referred to as "bonding surface W2$j$", and a surface opposite to the bonding surface W2$j$ will be referred to as "non-bonding surface W2$n$."

As depicted in FIG. 1, the bonding system 1 includes a carry-in/out station 2 and a processing station 3. The carry-in/out station 2 and the processing station 3 are arranged in this sequence along the positive X-axis direction. Further, the carry-in/out station 2 and the processing station 3 are connected as a single body.

The carry-in/out station 2 includes a placing table 10 and a transfer section 20. The placing table 10 is equipped with a multiple number of placing plates 11. Provided on the placing plates 11 are cassettes C1, C2 and C3 each of which accommodates therein a plurality of (e.g., 25 sheets of) substrates horizontally. For example, the cassette C1 accommodates therein upper wafers W1; the cassette C2, lower wafers W2; and the cassettes C3, combined wafers T.

The transfer section 20 is provided adjacent to the positive X-axis side of the placing table 10. Provided in the transfer section 20 are a transfer path 21 extended in the Y-axis direction and a transfer device 22 configured to be movable along the transfer path 21. The transfer device 22 is configured to be movable in the X-axis direction as well as in the Y-axis direction and pivotable around the Z-axis. Further, the transfer device 22 is also configured to transfer the upper wafers W1, the lower wafers W2 and the combined wafers T between the cassettes C1 to C3 placed on the placing plates 11 and a third processing block G3 of the processing station 3 to be described later.

Further, the number of the cassettes C1 to C3 placed on the placing plates 11 is not limited to the shown example. In addition, besides the cassettes C1 to C3, a cassette or the like for collecting a problematic substrate may be additionally provided on the placing plates 11.

A multiple number of, for example, three processing blocks G1, G2 and G3 equipped with various kinds of devices are provided in the processing station 3. For example, the first processing block G1 is provided at a front side (negative Y-axis side of FIG. 1) of the processing station 3, and the second processing block G2 is provided at a rear side (positive Y-axis side of FIG. 1) of the processing station 3. Further, the third processing block G3 is provided at a side of the carry-in/out station 2 (negative X-axis side of FIG. 1) of the processing station 3.

Provided in the first processing block G1 is a surface modifying apparatus 30 configured to modify the bonding surface W1$j$ of the upper wafer W1 and the bonding surface W2$j$ of the lower wafer W2. In the surface modifying apparatus 30, a $SiO_2$ bond on the bonding surfaces W1$j$ and W2$j$ of the upper wafer W1 and the lower wafer W2 is cut to be turned into SiO of a single bond, so that the bonding surfaces W1$j$ and W2$j$ are modified such that these surfaces are easily hydrophilized afterwards.

Furthermore, in the surface modifying apparatus 30, for example, an oxygen gas or a nitrogen gas as a processing gas is excited into plasma under a decompressed atmosphere to be ionized. As these oxygen ions or nitrogen ions are irradiated to the bonding surfaces W1$j$ and W2$j$ of the upper wafer W1 and the lower wafer W2, the bonding surfaces W1$j$ and W2$j$ are plasma-processed to be modified.

In the second processing block G2, a surface hydrophilizing apparatus 40 and a bonding apparatus 41 are disposed. The surface hydrophilizing apparatus 40 is configured to hydrophilize and clean the bonding surfaces W1$j$ and W2$j$ of the upper wafer W1 and the lower wafer W2 with, for example, pure water. In this surface hydrophilizing apparatus 40, while rotating the upper wafer W1 or the lower wafer W2 held by, for example, a spin chuck, the pure water is supplied onto the upper wafer W1 or the lower wafer W2. Accordingly, the pure water supplied onto the upper wafer W1 or the lower wafer W2 is diffused onto the bonding surface W1$j$ of the upper wafer W1 or the bonding surface W2$j$ of the lower wafer W2, so that the bonding surfaces W1$j$ and W2$j$ are hydrophilized.

The bonding apparatus 41 is configured to bond the upper wafer W1 and the lower wafer W2, which are hydrophilized, by an intermolecular force. A configuration of the bonding apparatus 41 will be discussed later.

In the third processing block G3, as shown in FIG. 2, transition (TRS) devices 50 and 51 for the upper wafer W1, the lower wafer W2 and the combined wafer T are provided in two levels in this order from below.

Further, as illustrated in FIG. 1, a transfer section 60 is formed in a region surrounded by the first processing block G1, the second processing block G2 and the third processing block G3. A transfer device 61 is provided in the transfer section 60. The transfer device 61 is equipped with, for example, a transfer arm which is configured to be movable in a vertical direction and a horizontal direction and pivotable around a vertical axis. The transfer device 61 is moved within the transfer section 60 and transfers the upper wafers W1, the lower wafers W2 and the combined wafers T with respect to preset devices within the first processing block G1, the second processing block G2 and the third processing block G3 which are adjacent to the transfer section 60.

Furthermore, as depicted in FIG. 1, the bonding system 1 includes a control device 70. The control device 70 controls an operation of the bonding system 1. The control device 70 may be implemented by, for example, a computer and includes a CPU (Central Processing Unit) 71, a recording medium 72 such as a memory, an input interface 73 and an output interface 74. The control device 70 carries out various kinds of controls by allowing the CPU 71 to execute a program stored in the recording medium 72. Further, the control device 70 receives a signal from an outside through the input interface 73 and transmits a signal to the outside through the output interface 74. The control device 70 is an example of an analyzer.

The program of the control device 70 is recorded in an information recording medium and installed from the information recording medium. The information recording medium may be, by way of non-limiting example, a hard disc (HD), a flexible disc (FD), a compact disc (CD), a magnet optical disc (MO), or a memory card. Further, the program may be installed by being downloaded from a server through Internet.

<Bonding Apparatus>

Figure 4:
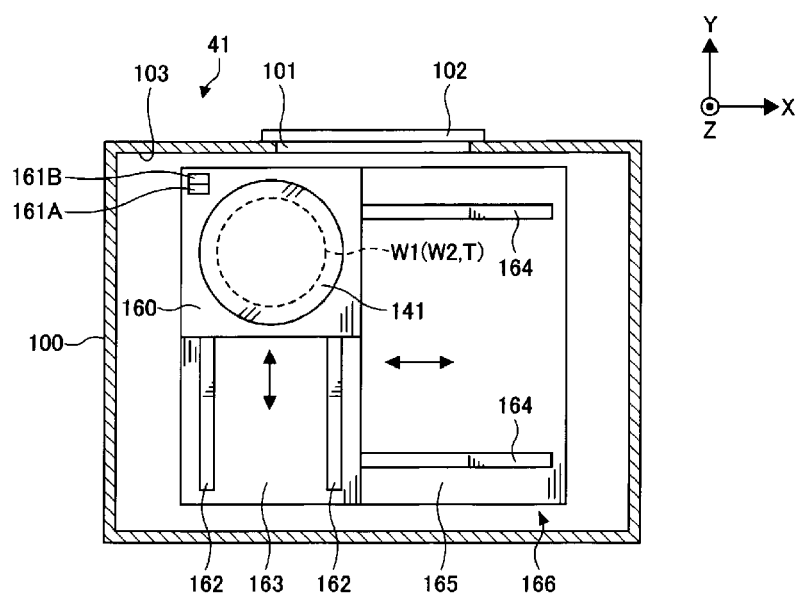
FIG. 4 is a plan view illustrating a bonding apparatus according to the exemplary embodiment.
Figure 5:
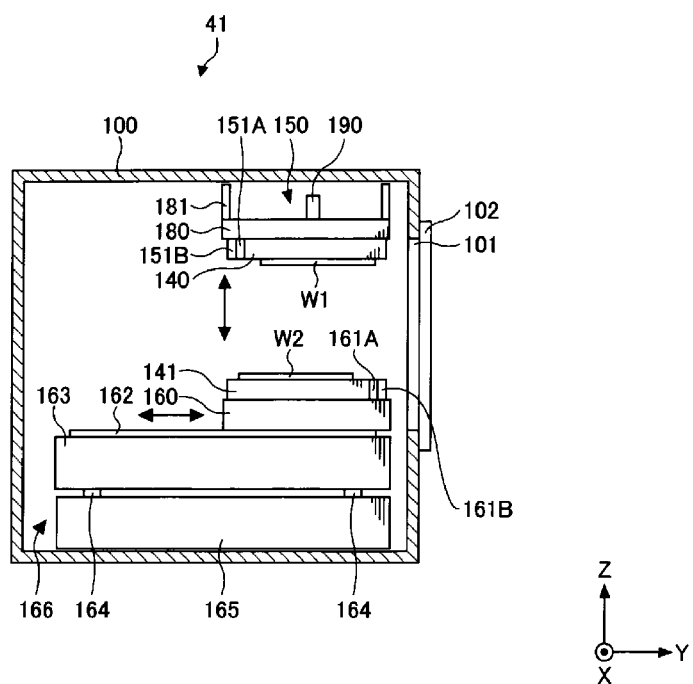
FIG. 5 is a side view illustrating the bonding apparatus according to the exemplary embodiment.

FIG. 4 is a plan view illustrating the bonding apparatus 41 according to the exemplary embodiment. FIG. 5 is a side view illustrating the bonding apparatus 41 according to the exemplary embodiment.

As depicted in FIG. 4, the bonding apparatus 41 includes a processing vessel 100 having a hermetically sealable inside. A carry-in/out opening 101 for the upper wafer W1, the lower wafer W2 and the combined wafer T is formed on a lateral side of the processing vessel 100 at a side of the transfer region 60. A shutter 102 for opening/closing the carry-in/out opening 101 is provided at the carry-in/out opening 101. The processing vessel 100 is an example of a processing chamber.

Provided within the processing vessel 100 are an upper chuck 140 configured to attract and hold a top surface (non-bonding surface W1n) of the upper wafer W1 from above and a lower chuck 141 configured to place thereon the lower wafer W and attract and hold a bottom surface (non-bonding surface W2n) of the lower wafer W2 from below. The lower chuck 141 is provided under the upper chuck 140 and configured to be arranged to face the upper chuck 140 in parallel. The upper chuck 140 and the lower chuck 141 are arranged apart from each other in the vertical direction.

As depicted in FIG. 5, the upper chuck 140 is held by an upper chuck holder 150 which is provided above the upper chuck 140. The upper chuck holder 150 is provided at a ceiling surface of the processing vessel 100. The upper chuck 140 is fixed to the processing vessel 100 with the upper chuck holder 150 therebetween.

The upper chuck holder 150 is equipped with an upper imaging device 151A configured to image a top surface (bonding surface W2j) of the lower wafer W2 held by the lower chuck 141. By way of example, a CCD camera is used as the upper imaging device 151A. The upper chuck holder 150 is also equipped with an upper displacement meter 151B configured to measure a displacement of the top surface (bonding surface W2j) of the lower wafer W2 held by the lower chuck 141. By way of example, a LED displacement meter is used as the upper displacement meter 151B. The upper imaging device 151A is an example of an imaging device, and the upper displacement meter 151B is an example of a displacement meter.

The lower chuck 141 is supported by a first lower chuck mover 160 provided below the lower chuck 141. The first lower chuck mover 160 moves the lower chuck 141 in the horizontal direction (Y-axis direction) as will be described later. Further, the first lower chuck mover 160 is also configured to be capable of moving the lower chuck 141 in the vertical direction and rotate the lower chuck 141 around a vertical axis.

The first lower chuck mover 160 is equipped with a lower imaging device 161A configured to image a bottom surface (bonding surface W1j) of the upper wafer W1 held by the upper chuck 140 (see FIG. 5). The lower imaging device 161A may be, by way of example, a CCD camera. The first lower chuck mover 160 is also equipped with a lower displacement meter 161B configured to measure a displacement of the bottom surface (bonding surface W1j) of the upper wafer W1 held by the upper chuck 140. The lower displacement meter 161B may be, by way of non-limiting example, a LED displacement meter.

The first lower chuck mover 160 is fastened to a pair of rails 162 which is provided at a bottom side of the first lower chuck mover 160 and extends in the horizontal direction (Y-axis direction). The first lower chuck mover 160 is configured to be movable along the rails 162.

The rails 162 are disposed on a second lower chuck mover 163. The second lower chuck mover 163 is fastened to a pair of rails 164 which is disposed at a bottom side of the second lower chuck mover 163 and extends in the horizontal direction (X-axis direction). The second lower chuck mover 163 is configured to be movable in the horizontal direction (X-axis direction) along the rails 164. Further, the rails 164 is disposed on the placing table 165 which is disposed at a bottom of the processing vessel 100.

The first lower chuck mover 160, the second lower chuck mover 163, and so forth constitute a position adjuster 166. The position adjuster 166 is configured to perform position adjustment in the horizontal direction between the upper wafer W1 held by the upper chuck 140 and the lower wafer W2 held by the lower chuck 141 by moving the lower chuck 141 in the X-axis direction, the Y-axis direction and the θ direction. Further, the position adjuster 166 is also configured to perform position adjustment in the vertical direction between the upper wafer W1 held by the upper chuck 140 and the lower wafer W2 held by the lower chuck 141 by moving the lower chuck 141 in the Z-axis direction.

Further, although the position adjuster 166 of the present exemplary embodiment carries out the position adjustment between the upper wafer W1 and the lower wafer W2 in the horizontal direction by moving the lower chuck 141 in the X-axis direction, the Y-axis direction and the θ direction, the present disclosure is not limited thereto. The way how the position adjuster 166 performs this position adjustment in the horizontal direction is not particularly limited as long as the upper chuck 140 and the lower chuck 141 are moved relatively to each other in the X-axis direction, the Y-axis direction and the θ direction. By way of example, the position adjuster 166 may perform the position adjustment between the upper wafer W1 and the lower wafer W2 by moving the lower chuck 141 in the X-axis direction and the Y-axis direction and by moving the upper chuck 140 in the θ direction.

Furthermore, although the position adjuster 166 of the present disclosure carries out the position adjustment between the upper wafer W1 and the lower wafer W2 in the vertical direction by moving the lower chuck 141 in the Z-axis direction, the present disclosure is not limited thereto. The way how the position adjuster 166 performs this position adjustment in the vertical direction is not particularly limited as long as the upper chuck 140 and the lower chuck 141 can be moved relatively to each other in the Z-axis direction. By way of example, the position adjuster 166 may perform the position adjustment between the upper wafer W1 and the lower wafer W2 in the vertical direction by moving the upper chuck 140 in the Z-axis direction.

Figure 6:
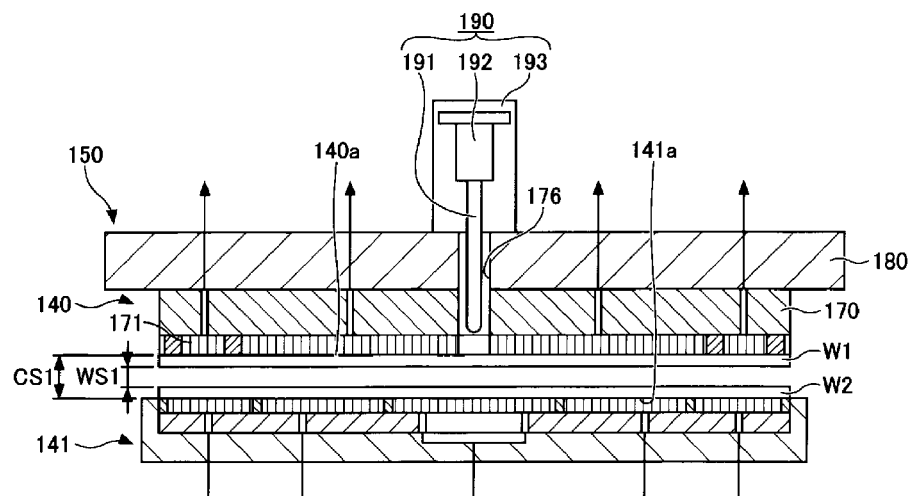
FIG. 6 is a cross sectional view illustrating an upper chuck and a lower chuck according to the exemplary embodiment, showing a state immediately before an upper wafer and a lower wafer are bonded.
Figure 7A:
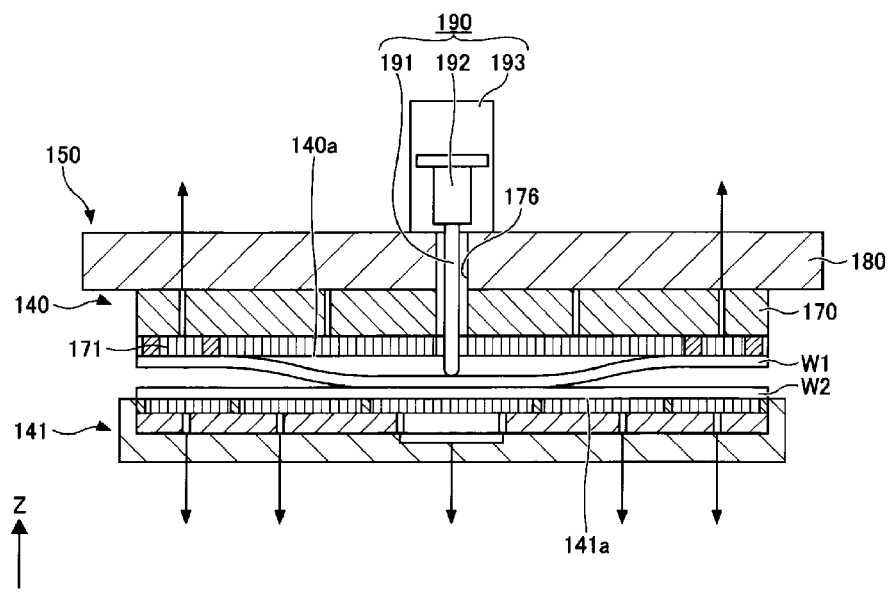
FIG. 7A and FIG. 7B are cross sectional views illustrating an operation through which the upper wafer and the lower wafer are gradually bonded from central portions toward peripheral portions thereof according to the exemplary embodiment.
Figure 7B:
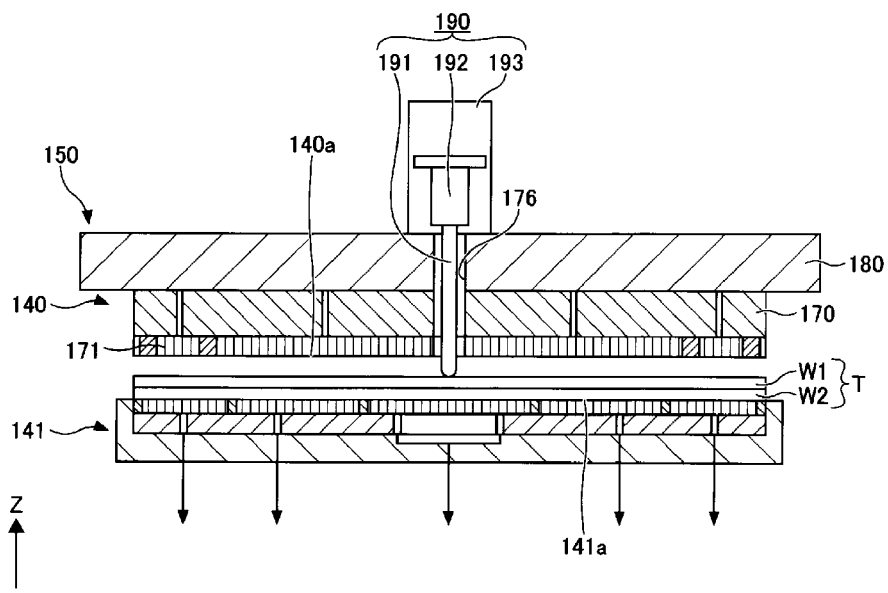

FIG. 6 is a cross sectional view illustrating the upper chuck and the lower chuck according to the exemplary embodiment, showing a state immediately before the upper wafer and the lower wafer are bonded. FIG. 7A is a cross sectional view illustrating a state in the middle of bonding between the upper wafer and the lower wafer according to the present exemplary embodiment. FIG. 7B is a cross sectional view illustrating a state upon the completion of the bonding between the upper wafer and the lower wafer according to the present exemplary embodiment. Solid-lined arrows in FIG. 6, FIG. 7A and FIG. 7B indicate a direction in which air is suctioned by a vacuum pump.

The upper chuck 140 and the lower chuck 141 are, for example, configured as vacuum chucks. In the present exemplary embodiment, the upper chuck 140 corresponds to a first holder described in claims, and the lower chuck 141 corresponds to a second holder described in the claims. The upper chuck 140 has, at the surface (bottom surface) thereof facing the lower chuck 141, an attraction surface 140a to which the upper wafer W1 is attracted. Meanwhile, the lower chuck 141 has, at the surface (top surface) facing the upper chuck 140, an attraction surface 141a to which the lower wafer W2 is attracted.

The upper chuck 140 has a chuck base 170. The chuck base 170 has a diameter equal to or larger than a diameter of the upper wafer W1. The chuck base 170 is supported by a supporting member 180. The supporting member 180 is disposed to cover at least the chuck base 170 when viewed from the top, and is fixed to the chuck base 170 by, for example, screws. The supporting member 180 is supported by a plurality of supporting columns 181 (see FIG. 5) provided at the ceiling surface of the processing vessel 100. The supporting member 180 and the plurality of supporting columns 181 constitute the upper chuck holder 150.

A through hole 176 is formed through the supporting member 180 and the chuck base 170 in the vertical direction. A position of the through hole 176 corresponds to a central portion of the upper wafer W1 attracted to and held by the upper chuck 140. A push pin 191 of a striker 190 is inserted into this through hole 176.

The striker 190 is provided on a top surface of the supporting member 180 and is equipped with the push pin 191, an actuator unit 192 and a linearly moving mechanism 193. The push pin 191 is a columnar member extending along the vertical direction and is supported by an actuator unit 192.

The actuator unit 192 is configured to generate a constant pressure in a certain direction (here, a vertically downward direction) by air supplied from, for example, an electro-pneumatic regulator (not shown). By the air supplied from the electro-pneumatic regulator, the actuator unit 192 is capable of controlling a press load applied to the central portion of the upper wafer W1 as it is brought into contact with the central portion of the upper wafer W1. Further, a leading end of the push pin 191 is movable up and down in the vertical direction through the through hole 176 by the air from the electro-pneumatic regulator.

The actuator unit 192 is supported at the linearly moving mechanism 193. The linearly moving mechanism 193 moves the actuator unit 192 in the vertical direction by a driving unit including a motor, for example.

The striker 190 is configured as described above, and controls a movement of the actuator unit 192 by the linearly moving mechanism 193 and controls the press load upon the upper wafer W1 from the push pin 191 by the actuator unit 192.

The striker 190 presses the upper wafer W1 attracted to and held by the upper chuck 140 and the lower wafer W2 attracted to and held by the lower chuck 141 to allow the upper wafer W1 and the lower wafer W2 to come into contact with each other. To elaborate, the striker 190 transforms the upper wafer W1 attracted to and held by the upper chuck 140, thus allowing the upper wafer W1 to be pressed in contact with the lower wafer W2. The striker 190 corresponds to a pressing unit described in the claims.

A plurality of pins 171 is provided on a bottom surface of the chuck base 170, and these pins 171 are in contact with the non-bonding surface W1n of the upper wafer W1. The upper chuck 140 is composed of the chuck base 170, the plurality of pins 171, and so forth. The attraction surface 140a of the upper chuck 140 which attracts and holds the upper wafer W1 is divided into multiple regions in a diametrical direction, and generation of an attracting force and release of the attracting force are performed for divided regions individually.

Further, the lower chuck 141 may be configured the same as the upper chuck 140. The lower chuck 141 has a plurality of pins in contact with the non-bonding surface W2n of the lower wafer W2. The attraction surface 141a of the lower chuck W1 which attracts and holds the lower wafer W2 is divided into multiple regions in the diametrical direction, and generation of an attracting force and release of the attracting force are performed for divided regions individually.

<Bonding Method>

Figure 8:
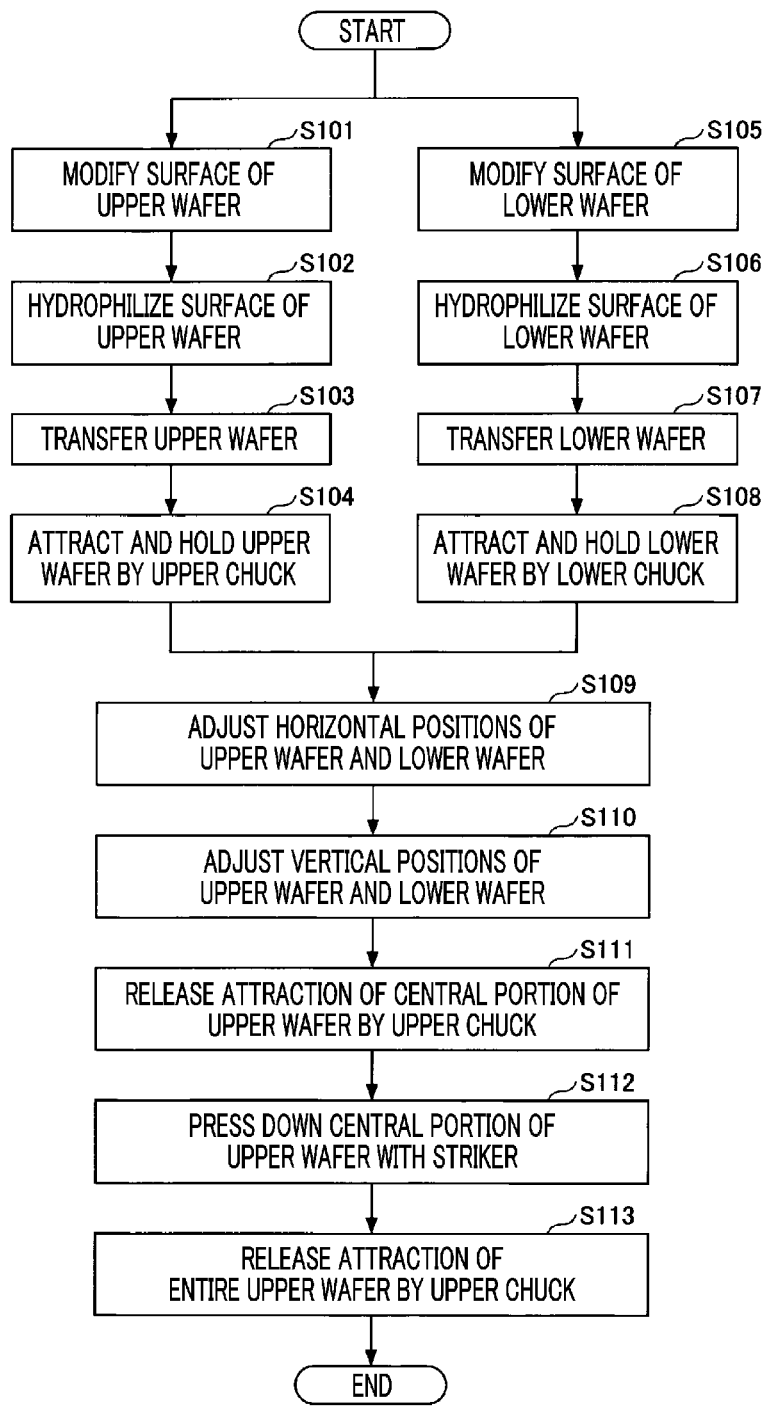
FIG. 8 is a flowchart illustrating a part of a processing performed by the bonding system according to the exemplary embodiment.

FIG. 8 is a flowchart illustrating a part of a processing performed by the bonding system according to the exemplary embodiment. Further, the various processes shown in FIG. 8 are performed under the control of the control device 70.

First, a cassette C1 accommodating a plurality of upper wafers W1, a cassette C2 accommodating a plurality of lower wafers W2 and an empty cassette C3 are placed on the preset placing plates 11 of the carry-in/out station 2. Then, an upper wafer W1 is taken out of the cassette C1 by the transfer device 22 and is transferred to the transition device 50 of the third processing block G3 of the processing station 3.

Subsequently, the upper wafer W1 is transferred into the surface modifying apparatus 30 of the first processing block G1 by the transfer device 61. In the surface modifying apparatus 30, an oxygen gas as the processing gas is formed into plasma to be ionized under the preset decompressed atmosphere. The oxygen ions are irradiated to the bonding surface W1j of the upper wafer W1, and the bonding surface W1j is plasma-processed. As a result, the bonding surface W1j of the upper wafer W1 is modified (process S101).

Then, the upper wafer W1 is transferred into the surface hydrophilizing apparatus 40 of the second processing block G2 by the transfer device 61. In the surface hydrophilizing apparatus 40, the pure water is supplied onto the upper wafer W1 while rotating the upper wafer W1 held by the spin chuck. The supplied pure water is diffused on the bonding surface W1*j* of the upper wafer W1, and hydroxyl groups (silanol groups) adhere to the bonding surface W1*j* of the upper wafer W1 modified in the surface modifying apparatus 30, so that the bonding surface W1*j* is hydrophilized (process S102). Further, the bonding surface W1*j* of the upper wafer W1 is cleaned by this pure water used to hydrophilize the bonding surface W1*j*.

Thereafter, the upper wafer W1 is transferred into the bonding apparatus 41 of the second processing block G2 by the transfer device 61 (process S103). At this time, the front surface and the rear surface of the upper wafer W1 are inverted. That is, the bonding surface W1*j* of the upper wafer W1 is turned to face down.

Afterwards, within the bonding apparatus 41, the transfer arm of the transfer device 61 is moved to be located under the upper chuck 140. Then, the upper wafer W1 is delivered to the upper chuck 140 from the transfer arm. The upper wafer W1 is attracted to and held by the upper chuck 140 with the non-bonding surface W1*n* thereof in contact with the upper chuck 140 (process S104).

While the above-described processes S101 to S104 are being performed on the upper wafer W1, a processing of the lower wafer W2 is performed. First, the lower wafer W2 is taken out of the cassette C2 by the transfer device 22 and transferred into the transition device 50 of the processing station 3 by the transfer device 22.

Thereafter, the lower wafer W2 is transferred into the surface modifying apparatus 30 by the transfer device 61, and the bonding surface W2*j* of the lower wafer W2 is modified (process S105). Further, the modification of the bonding surface W2*j* of the lower wafer W2 in the process S105 is the same as the above-stated process S101.

Then, the lower wafer W2 is transferred into the surface hydrophilizing apparatus 40 by the transfer device 61, and the bonding surface W2*j* of the lower wafer W2 is hydrophilized (process S106). Further, the bonding surface W2*j* is cleaned by the pure water used to hydrophilize the bonding surface W2*j*. The hydrophilizing of the bonding surface W2*j* of the lower wafer W2 in the process S106 is the same as the hydrophilizing of the bonding surface W1*j* of the upper wafer W1 in the above-described process S102.

Subsequently, the lower wafer W2 is transferred into the bonding apparatus 41 by the transfer device 61 (process S107).

Then, within the bonding apparatus 41, the transfer arm of the transfer device 61 is moved to be located above the lower chuck 141. Then, the lower wafer W2 is delivered onto the lower chuck 141 from the transfer arm. The lower wafer W2 is attracted to and held on the lower chuck 141 with the non-bonding surface W2*n* thereof in contact with the lower chuck 141 (process S108).

Thereafter, the position adjustment in the horizontal direction between the upper wafer W1 held by the upper chuck 140 and the lower wafer W2 held by the lower chuck 141 is performed (process S109). In this position adjustment, the alignment marks W1*a*, W1*b* and W1*c* (see FIG. 9A to FIG. 9C) previously formed on the bonding surface W1*j* of the upper wafer W1 or the alignment marks W2*a*, W2*b* and W2*c* previously formed on the bonding surface W2*j* of the lower wafer W2 (see FIG. 9A to FIG. 9C) are used.

Figure 9A:
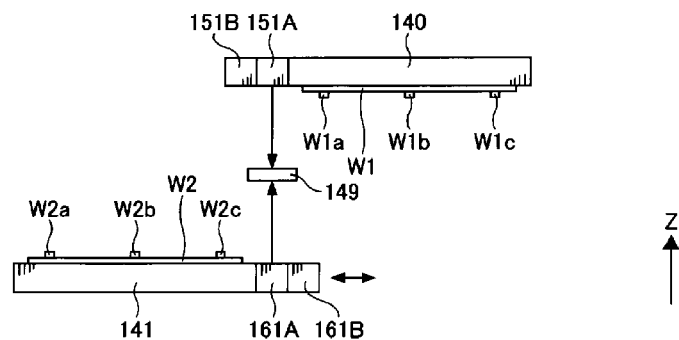
FIG. 9A to FIG. 9C are explanatory diagrams illustrating an operation of adjusting positions of the upper wafer and the lower wafer in a horizontal direction.
Figure 9B:
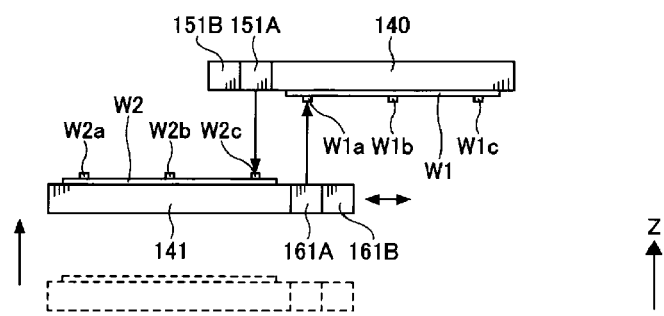
Figure 9C:
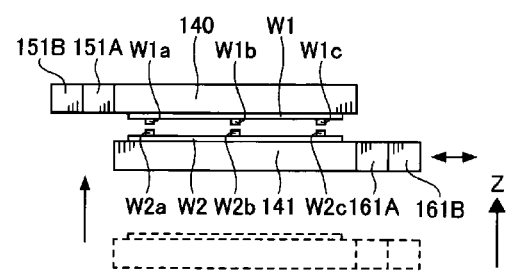

An operation of the position adjustment of the upper wafer W1 and the lower wafer W2 in the horizontal direction will be elaborated with reference to FIG. 9A to FIG. 9C. FIG. 9A is a diagram for describing an operation of performing the position adjustment between the upper imaging device and the lower imaging device according to the present exemplary embodiment. FIG. 9B is a diagram for describing an imaging operation through which the upper imaging device images the lower wafer and an imaging operation through which the lower imaging device images the upper wafer according to the present exemplary embodiment. FIG. 9C is a diagram for describing an operation of performing the position adjustment between the upper wafer and the lower wafer according to the present exemplary embodiment.

First, as shown in FIG. 9A, the position adjustment between the upper imaging device 151A and the lower imaging device 161A in the horizontal direction is performed. To elaborate, the lower chuck 141 is moved in the horizontal direction by the position adjuster 166 to allow the lower imaging device 161A to be located under the upper imaging device 151A approximately. Then, a common target 149 is checked by the upper imaging device 151A and the lower imaging device 161A, and a position of the lower imaging device 161A in the horizontal direction is finely adjusted so that the positions of the upper imaging device 151A and the lower imaging device 161A in the horizontal direction are coincident.

Then, as depicted in FIG. 9B, the lower chuck 141 is moved in the vertically upward direction by the position adjuster 166. Then, while moving the lower chuck 141 in the horizontal direction by the position adjuster 166, the alignment marks W2*c*, W2*b* and W2*a* on the bonding surface W2*j* of the lower wafer W2 are imaged in sequence by using the upper imaging device 151A. Concurrently, while moving the lower chuck 141 in the horizontal direction, the alignment marks W1*a*, W1*b* and W1*c* on the bonding surface W1*j* of the upper wafer W1 are imaged in sequence by using the lower imaging device 161A. FIG. 9B shows a state in which the alignment marks W2*c* of the lower wafer W2 is imaged by the upper imaging device 151A and the alignment mark W1*a* of the upper wafer W1 is imaged by the lower imaging device 161A.

The obtained image data are output to the control device 70. Based on the image data obtained by the upper imaging device 151A and the image data obtained by the lower imaging device 161A, the control device 70 controls the position adjuster 166 to adjust the position of the lower chuck 141 in the horizontal direction. This horizontal position adjustment is carried out such that the alignment marks W1*a*, W1*b* and W1*c* of the upper wafer W1 and the alignment marks W2*a*, W2*b* and W2*c* of the lower wafer W2 are respectively overlapped, when viewed in the vertical direction. In this way, the horizontal positions of the upper chuck 140 and the lower chuck 141 are adjusted, and the horizontal positions (for example, including positions in the X-axis direction, the Y-axis direction and the θ direction) of the upper wafer W1 and the lower wafer W2 are adjusted.

Thereafter, as indicated by solid lines in FIG. 9C, the position adjustment in the vertical direction between the upper wafer W1 held by the upper chuck 140 and the lower wafer W2 held by the lower chuck 141 is performed (process S110). To elaborate, the position adjuster 166 moves the lower chuck 141 in the vertically upward direction, thus allowing the lower wafer W2 to approach the upper wafer W1. Accordingly, as shown in FIG. 6, a distance WS1 between the bonding surface W2*j* of the lower wafer W2 and the bonding surface W1j of the upper wafer W1 is adjusted to, e.g., 50 μm to 200 μm. For example, the distance WS1 may be measured by the upper displacement meter 151B and the lower displacement meter 161B.

Subsequently, after releasing the attracting and holding of the central portion of the upper wafer W1 by the upper chuck 140 (process S111), the push pin 191 of the striker 190 is lowered, so that the central portion of the upper wafer W1 is pressed down (process S112), as shown in FIG. 7A. If the central portion of the upper wafer W1 comes into contact with the central portion of the lower wafer W2 and the central portion of the upper wafer W1 and the central portion of the lower wafer W2 are pressed against each other with a preset force, the central portion of the upper wafer W1 and the central portion of the lower wafer W2 which are pressed against each other are begun to be bonded. Then, a bonding wave whereby the upper wafer W1 and the lower wafer W2 are gradually bonded from the central portion toward the peripheral portions thereof is generated.

Here, since the bonding surface W1j of the upper wafer W1 and the bonding surface W2j of the lower wafer W2 are modified in the processes S101 and S105, respectively, a Van der Waals force (intermolecular force) is generated between the bonding surfaces W1j and W2j, so that the bonding surfaces W1j and W2j are bonded. Further, since the bonding surface W1j of the upper wafer W1 and the bonding surface W2j of the lower wafer W2 are hydrophilized in the processes S102 and S106, respectively, hydrophilic groups between the bonding surfaces W1j and W2j are hydrogen-bonded, so that the bonding surfaces W1j and W2j are firmly bonded.

Thereafter, while pressing the central portion of the upper wafer W1 and the central portion of the lower wafer W2 with the push pin 191, the attracting and holding of the entire upper wafer W1 by the upper chuck 140 is released (process S113). Accordingly, as depicted in FIG. 7B, the entire bonding surface W1j of the upper wafer W1 and the entire bonding surface W2j of the lower wafer W2 come into contact with each other, and the upper wafer W1 and the lower wafer W2 are bonded. Thereafter, the push pin 191 is raised up to the upper chuck 140, and the attracting and holding of the lower wafer W2 by the lower chuck 141 is released.

Thereafter, the combined wafer T is transferred to the transition device 51 of the third processing block G3 by the transfer device 61, and then is transferred into the cassette C3 by the transfer device 22 of the carry-in/out station 2. Through these processes, the series of operations of the bonding processing are completed.

<Foreign Substance Inspection on Lower Chuck>

The series of operations of the bonding processing described in the processes S101 to S113 shown in FIG. 8 are repeated, so that the combine wafers T are manufactured repeatedly. Meanwhile, in the processes in which the upper wafer W1 and the lower wafer W2 are brought into contact with and bonded to each other as shown in FIG. 6, the lower wafer W2 may be attracted to and held by the lower chuck 141 in the state that a foreign substance adheres to the non-bonding surface W2n. If such a foreign substance exists, the lower wafer W2 may be deformed and protrusion of the upper wafer W2 may occur. As a result, a void may be formed between the lower wafer W2 and the upper wafer W1. Furthermore, if the foreign substance remains on the lower chuck 141, the void may be continuously formed afterwards unless the foreign substance is eliminated.

Figure 10:
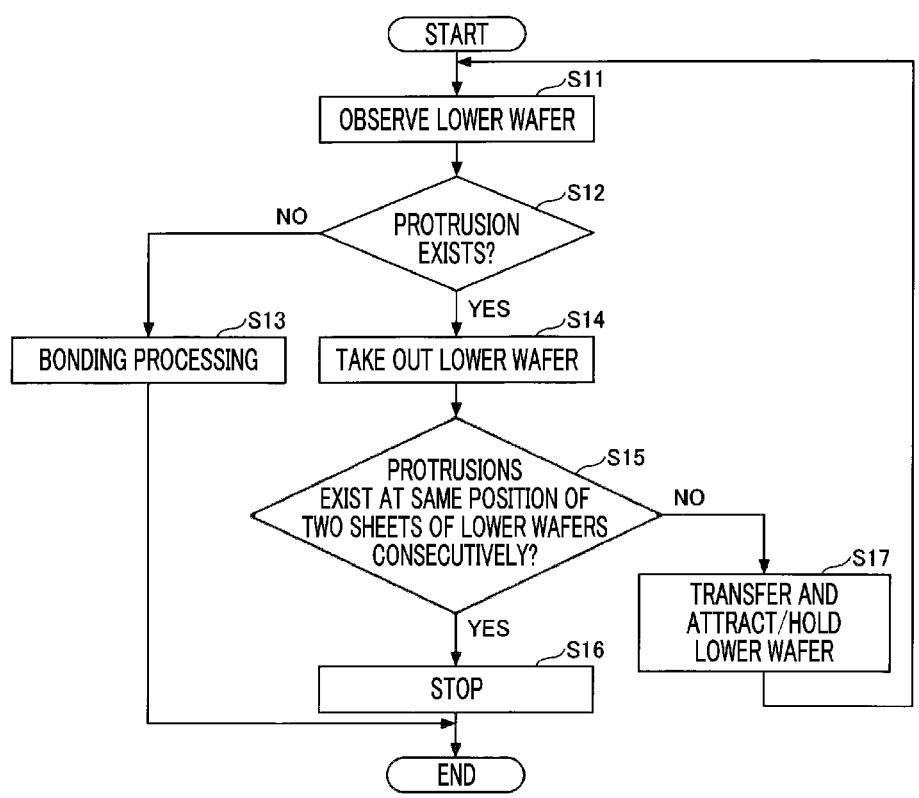
FIG. 10 is a flowchart illustrating a method of inspecting a foreign substance according to the exemplary embodiment.

As a resolution, in the present exemplary embodiment, foreign substance inspection is performed appropriately after the lower wafer W2 is attracted to and held by the lower chuck 141 (process S108) and before the horizontal position adjustment between the upper wafer W1 and the lower wafer W2 is performed (process S109). FIG. 10 is a flowchart illustrating a method of performing the foreign substance inspection according to the exemplary embodiment. Various processes shown in FIG. 10 are performed under the control of the control device 70.

First, if the lower wafer W2 is attracted to and held by the lower chuck 141, the top surface (bonding surface W2j) of the lower wafer W2 is observed (process S11).

Then, if protrusion, which satisfies a preset condition, does not exist on the bonding surface W2j of the lower wafer W2 (process S12), the bonding processing is performed (process S13). That is, the horizontal position adjustment between the upper wafer W1 and the lower wafer W2 is performed (process S109), and the processes S110 to S113 are then performed. Details of a method of performing the observation in the process S11 and making the determination upon the presence or absence of the protrusion in the process S12 will be elaborated later. The preset condition is related to a height from the top surface of the lower chuck 141, and the protrusion is caused mainly by the foreign substance. The protrusion is an example of a singularity.

Meanwhile, if the protrusion, which satisfies the preset condition, is found on the bonding surface W2j of the lower wafer W2 (process S12), the lower wafer W2 is taken out of the bonding apparatus 41 (process S14).

Then, it is detected whether the protrusion is found at the same position of two sheets of lower wafers W2 consecutively (process S15). If the protrusion is detected at the same position, it means that the foreign substance exists, and if the processing is continued in this state, there is a high likelihood that the void may be formed at a next combined wafer T. Thus, the bonding processing is stopped (process S16). In this case, the stopping of the bonding processing is notified to the operator by using, for example, a lamp or a sound, or both of them. Further, in case that there is a host computer which manages the bonding system 1, the stopping of the bonding processing may be notified to the host computer.

Meanwhile, if the protrusion is not detected at the same position of the two sheets of lower wafers W2 consecutively, the transfer (process 107) and the attracting/holding (process S108) of another lower wafer W2 are performed (process S17). This is because that if the protrusion is detected only at a single sheet of lower wafer W2, the foreign substance having caused the protrusion may be removed from the bonding apparatus 41 when this lower wafer W2 is taken out of the bonding apparatus 41 in the process S14 and may not remain on the lower chuck 141. After transferring and attracting/holding this another lower wafer W2, the bonding surface W2j of this lower wafer W2 is observed (process S11).

According to the present exemplary embodiment, the foreign substance inspection upon the top surface of the lower chuck 141 can be performed appropriately. Accordingly, even if the foreign substance is carried into the bonding apparatus 41 by being attached to the non-bonding surface W2n of the lower wafer W2 and this foreign substance remains on the top surface of the lower chuck 141, this foreign substance can be detected appropriately.

Further, in the present exemplary embodiment, presence or absence of the protrusion is determined by observing the top surface (bonding surface W2j) of the lower wafer W2 attracted to and held by the lower chuck 141. By way of example, in case that the foreign substance has a thin needle shape extending in the Z-axis direction, this foreign substance may be difficult to detect if the lower wafer W2 is observed from directly above without being placed on the lower chuck 141. If the lower wafer W2 is placed on the lower chuck 141, however, this lower wafer W2 may be deformed over a wide range by being affected by the foreign substance, and the protrusion of this lower wafer W2 may occur. Thus, a feature indicting the presence of the foreign substance appears in a wide range across the top surface of the lower wafer W2, so that it is easy to detect the presence of the foreign substance.

Figure 11:
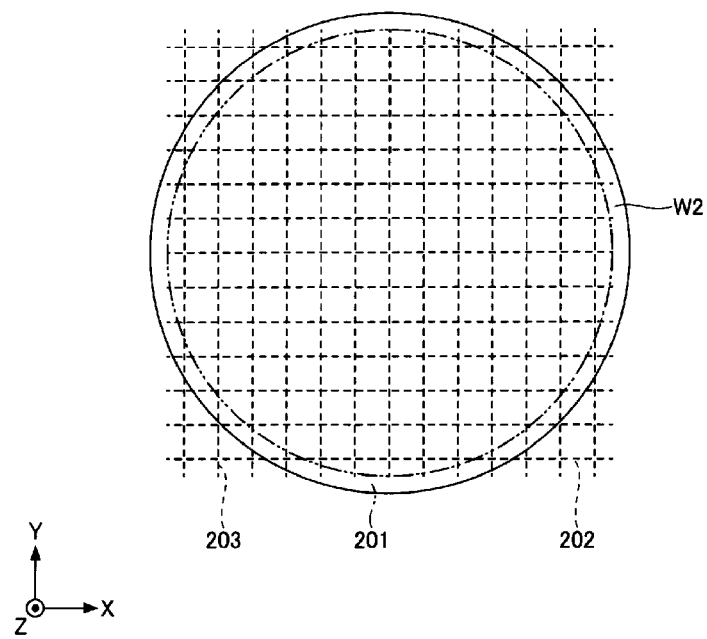
FIG. 11 is a first schematic diagram illustrating a first example of a method of observing a top surface of the lower wafer and determining presence or absence of protrusion.
Figure 12:
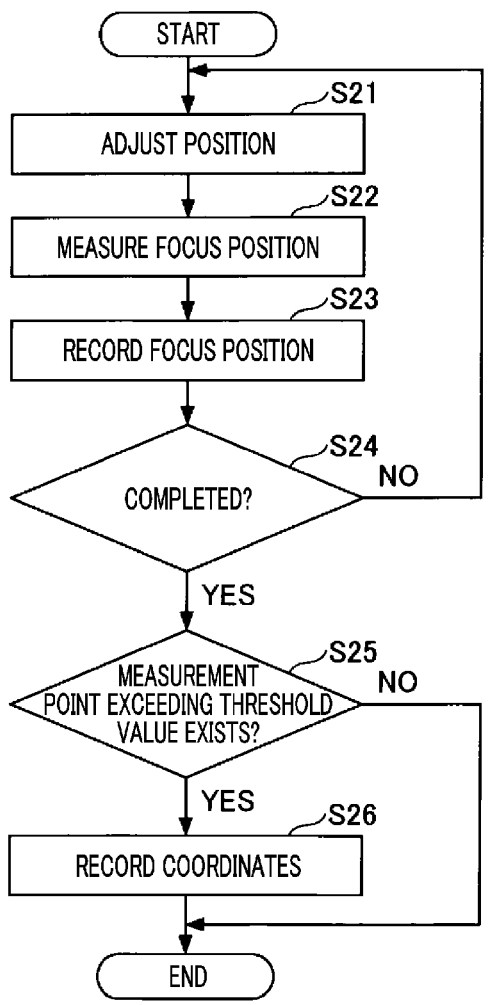
FIG. 12 is a flowchart illustrating the first example of the method of observing the top surface of the lower chuck and determining presence or absence of the protrusion.

First Example of Method of Observing Top Surface of Lower Wafer and Determining Presence or Absence of Protrusion Now, a first example of the method of observing the top surface of the lower wafer in the process S11 and determining presence or absence of the protrusion in the process S12 will be explained. FIG. 11 is a schematic diagram illustrating the first example of the method of observing the top surface of the lower wafer and determining presence or absence of the protrusion. FIG. 12 is a flowchart illustrating the first example of the method of observing the top surface of the lower wafer and determining presence or absence of the protrusion. Further, various processes shown in FIG. 12 are performed under the control of the control device 70.

In the first example, the top surface of the lower wafer W2 is observed by using the upper imaging device 151A. To be more specific, observation patterns are previously formed at multiple positions on the top surface of the lower wafer W2, and focus adjustment is performed for each observation pattern by the upper imaging device 151A. Then, a distance to each observation pattern in the Z-axis direction is specified based on a focus position. For example, as illustrated in FIG. 11, on the top surface of the lower wafer W2, intersection points between a multiple number of straight lines 202 extending in the X-axis direction and arranged at a regular distance therebetween in the Y-axis direction and a multiple number of straight lines 203 extending in the Y-axis direction and arranged at a regular distance therebetween in the X-axis direction are set as measurement points, and the observation patterns are provided at these measurement points. The distance between the straight lines 202 and 203 is set to be, e.g., 10 mm to 30 mm. The observation patterns may not be provided in a region 201 on a periphery of the lower wafer W2 where no semiconductor chip or the like is formed.

In the first example, the lower chuck 141 is moved in the horizontal direction by the position adjuster 166 to allow the upper imaging device 151A to be located above one of the measurement points (process S21).

Then, the focus adjustment by the upper imaging device 151A is performed, and a focus position of the observation pattern at the corresponding measurement point is measured (process S22). Then, the focus position is recorded (process S23).

The series of processes S21 to S23 are repeated until the measuring and the recoding of the focus position are completed for all of the measurement points (process S24).

Upon the completion of the measuring and the recording of the focus position for all the measurement points (process S24), the focus positions are analyzed, and it is determined whether the protrusion exists. That is, it is determined whether there is a measurement point where a Z-coordinate Z1 of a focus position is larger than a Z-coordinate Z2 of a focus position at a nearby measurement point and a difference between the Z-coordinates Z1 and Z2 exceeds a preset threshold value Zth, for example, 10 µm (process S25).

If there is no measurement point where the Z-coordinate Z1 is larger than the Z-coordinate Z2 and the difference therebetween exceeds the threshold value Zth, it is deemed that the lower wafer W2 does not have the protrusion on the entire top surface thereof, and the processing is ended. In this case, the processing then proceeds to the process S13 (see FIG. 10).

Figure 13:
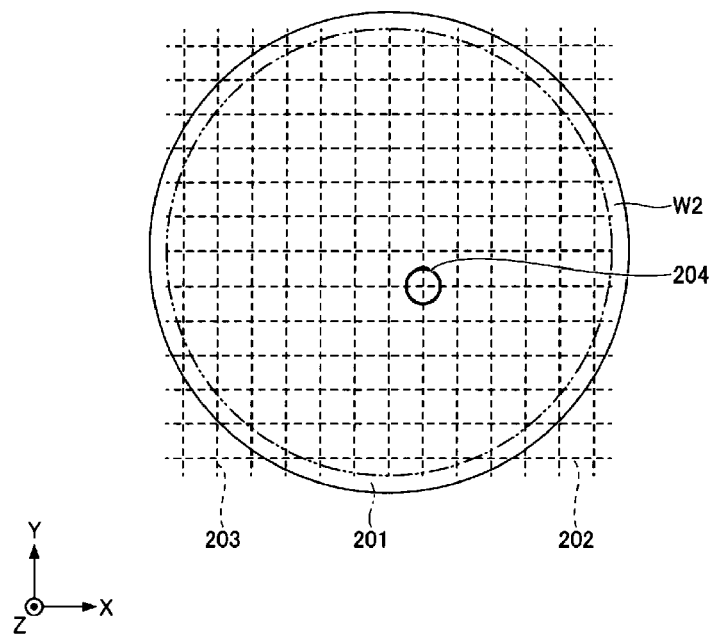
FIG. 13 is a second schematic diagram illustrating the first example of the method of observing the top surface of the lower wafer and determining presence or absence of the protrusion.

Meanwhile, if there is a measurement point where the Z-coordinate Z1 is larger than the Z-coordinate Z2 and the difference therebetween exceeds the threshold value Zth, it is deemed that the protrusion exists at the corresponding measurement point, and an X-coordinate and a Y-coordinate of the corresponding measurement point are specified and recorded, and the processing is ended (process S26). In this case, the processing then proceeds to the process S14 (see FIG. 10). For example, as depicted in FIG. 13, if a Z-coordinate Z1 at a measurement point 204 is larger than a Z-coordinate Z2 at a nearby measurement point and the difference therebetween is larger than the threshold value Zth, an X-coordinate and a Y-coordinate of the measurement point 204 are specified and recorded. The measurement point 204 are adjacent to two measurement points in the X-axis direction and two measurement points in the Y-axis direction. If the aforementioned relationship is established between the measurement point 204 and at least one of these neighboring measurement points, the X-coordinate and the Y-coordinate of the measurement point 204 are specified and recorded. In the process S15, it is determined, based on the X-coordinate and the Y-coordinate recorded in the process S26, whether the protrusion exists at the same measurement point on two sheets of lower wafers consecutively.

In the first example, the above-described series of processes are performed. According to the first example, a height of the protrusion can be specified accurately.

Further, the reference for the determination of the presence or absence of the protrusion in the process S25 is not limited to the above-described example. By way of example, it may be determined whether there exists a measurement point, within the all measurement regions, where a difference from a minimum Z-coordinate Zmin exceeds a predetermined threshold value Zth, for example, 10 µm.

Figure 14:
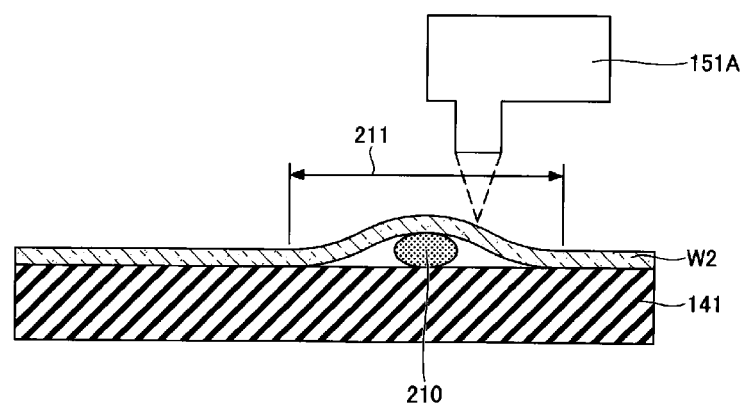
FIG. 14 is a diagram showing a relationship between the foreign substance and the protrusion of the lower wafer.

Furthermore, as shown in FIG. 14, even if the upper imaging device 151A is not located directly above a foreign substance 210 on the lower chuck 141, the protrusion can still be detected if the upper imaging device 151A is located above a range 211 where the lower wafer W2 is protruded because of the foreign substance 210. Thus, it is desirable to set the distance between the measurement points based on a size of the foreign substance which causes the formation of the void between the lower wafer W2 and the upper wafer W1.

Figure 15:
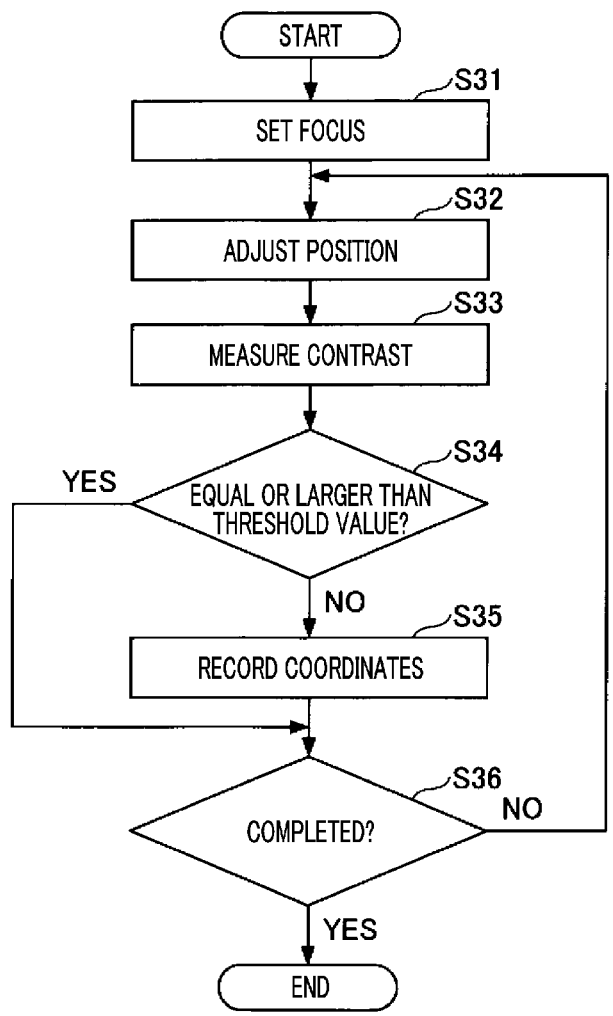
FIG. 15 is a flowchart illustrating a second example of the method of observing the top surface of the lower wafer and determining presence or absence of the protrusion.

Second Example of Method of Observing Top Surface of Lower Wafer and Determining Presence or Absence of Protrusion Now, a second example of the method of observing the top surface of the lower wafer in the process S11 and determining presence or absence of the protrusion in the process S12 will be explained. FIG. 15 is a flowchart illustrating the second example of the method of observing the top surface of the lower wafer and determining presence or absence of the protrusion. Further, various processes shown in FIG. 15 are performed under the control of the control device 70.

In the second example, the top surface of the lower wafer W2 is observed by using the upper imaging device 151A. To elaborate, observation patterns are previously formed at multiple positions on the top surface of the lower wafer W2, and a focus is fixed based on, for example, a distance between the upper imaging device 151A and the lower wafer W2 in the foreign substance inspection, and it is determined whether a proper contrast is obtained for each observation pattern. For example, as in the first example, the intersection points between the straight lines 202 and the straight lines 203 are set as the measurement points, and the observation patterns are formed at these measurement points.

In the second example, the focus is first set and fixed based on the distance between the upper imaging device 151A and the lower wafer W2 or the like (process S31). The focus set in the process S31 is a focus for the observation pattern when the top surface of the lower wafer W2 attracted to and held by the lower chuck 141 is observed in the state that no foreign substance exists on the top surface of the lower chuck 141. Thus, if no foreign substance exits across the entire top surface of the lower chuck 141, the observation pattern at each measurement point can be observed with a high contrast.

Subsequently, the lower chuck 141 is moved in the horizontal direction by the position adjuster 166 to allow the upper imaging device 151A to be located above one of the measurement points (process S32).

Thereafter, while maintaining the focus fixed, the observation pattern is observed by the upper imaging device 151A, and a height of the contrast thereof is measured (process S33).

Then, the height of the contrast measured in the process S33 is analyzed, and it is determined whether the height of the contrast is equal to or larger than a threshold value (process S34). If the height of the contrast measured in the process S33 is equal to or higher than the threshold value, it is deemed that no protrusion exists at the corresponding measurement point, so the processing proceeds to a process S36. Here, the height of the contrast obtained when the protrusion is caused as a result of the foreign substance having a height of, e.g., 10 µm is used as the threshold value for the height of the contrast.

Meanwhile, if the contrast measured in the process S33 is not equal to or larger than the threshold value, it is deemed that an out-focus is caused as the protrusion exists at the corresponding measurement point, and an X-coordinate and a Y-coordinate of the corresponding measurement point are specified and recorded (process S35). Then, the processing proceeds to the process S36.

The series of processes S31 to S35 are repeated until the measuring of the contrast is performed for all the measurement points and the recording of the coordinates of measurement point having a contrast less than the threshold value is completed, and, then, the processing is ended (process S36).

If the contrasts at all the measurement points are equal to or larger than the threshold value, it is determined that no protrusion exists on the entire top surface of the corresponding lower wafer W2, and the processing proceeds to the process S13 (see FIG. 10). Meanwhile, if a contrast at a certain measurement point is less than the threshold value, it is determined that the protrusion exists on the top surface of the corresponding lower wafer W2, and the processing proceeds to the process S14 (see FIG. 10).

In the second example, the above-described series of processes are performed. According to the second example, since the focus adjustment need not be performed at each measurement point, a time required to complete the series of processes can be shortened.

Figure 16:
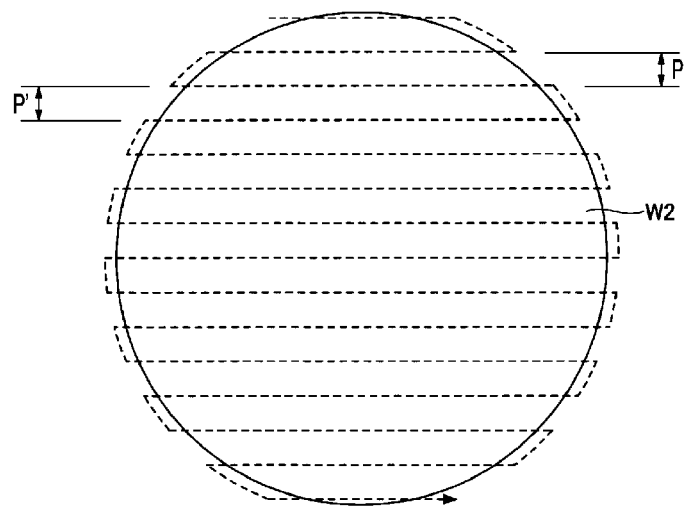
FIG. 16 is a first schematic diagram illustrating a third example of the method of observing the top surface of the lower wafer and determining presence or absence of the protrusion.
Figure 17:
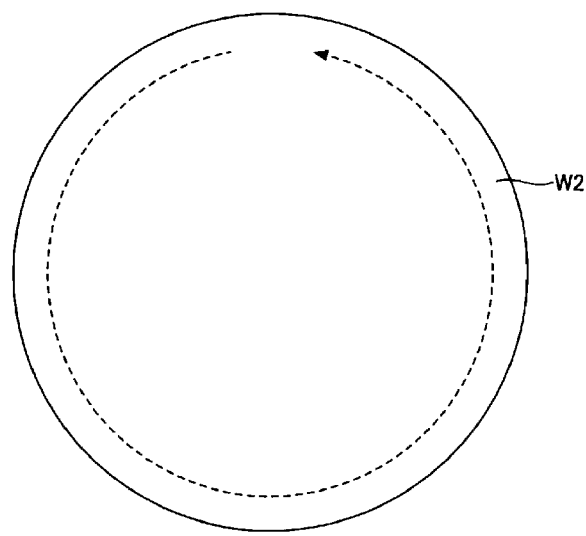
FIG. 17 is a second schematic diagram illustrating the third example of the method of observing the top surface of the lower wafer and determining presence or absence of the protrusion.
Figure 18:
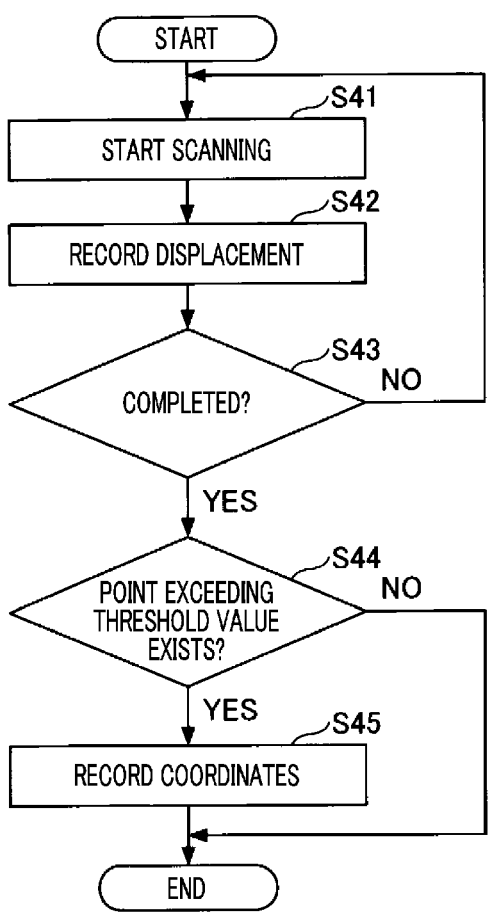
FIG. 18 is a flowchart illustrating the third example of the method of observing the top surface of the lower wafer and determining presence or absence of the protrusion.

Third Example of Method of Observing Top Surface of Lower Wafer and Determining Presence or Absence of Protrusion Now, a third example of the method of observing the top surface of the lower wafer in the process S11 and determining presence or absence of the protrusion in the process S12 will be explained. FIG. 16 is a first schematic diagram illustrating the third example of the method of observing the top surface of the lower wafer and determining presence or absence of the protrusion. FIG. 17 is a second schematic diagram illustrating the third example of the method of observing the top surface of the lower wafer and determining presence or absence of the protrusion. FIG. 18 is a flowchart illustrating the third example of the method of observing the top surface of the lower wafer and determining presence or absence of the protrusion. Further, various processes shown in FIG. 18 are performed under the control of the control device 70.

In the third example, the top surface of the lower wafer W2 is observed by using the upper displacement meter 151B. To be more specific, while scanning the entire top surface of the lower wafer W2 as illustrated in FIG. 16 or while scanning a peripheral portion of the top surface of the lower wafer W2 as illustrated in FIG. 17, a displacement (Z-displacement) (Z-coordinate) of the top surface of the lower wafer W2 in the Z-axis direction is measured by the upper displacement meter 151B.

In the third example, scanning is first begun by moving the lower chuck 141 in the horizontal direction by the position adjuster 166 (process S41). While carrying on the scanning, the Z-displacement (Z-coordinate) of the top surface of the lower wafer W2 is measured by the upper displacement meter 151B, and the measured Z-displacement is recorded (process S42). A scanning target may be the entire top surface of the lower wafer W2 as illustrated in FIG. 16, or may be the peripheral portion of the top surface of the lower wafer W2 as illustrated in FIG. 17.

The series of processes S41 and S42 are repeated until the measuring and recording of the Z-displacement is completed for the entire scanning target (process S43).

Upon the completion of the measuring and the recording of the Z-displacement for all of measurement points (process S43), the Z-displacements are analyzed to determine whether the protrusion exists. That is, it is determined whether there is a point, within a region of the scanning target, where a difference from a minimum Z-coordinate Zmin exceeds a predetermined threshold value Zth, e.g., 10 µm (process S44).

If there is no point where the difference from the minimum Z-coordinate Zmin exceeds the threshold value Zth, it is determined that no protrusion exists on the entire top surface of the corresponding lower wafer W2, and the processing is ended. In this case, the processing then proceeds to the process S13 (see FIG. 10).

Meanwhile, if there is a point where the difference from the minimum Z-coordinate Zmin exceeds the threshold value Zth, it is determined that the protrusion exists, and a X-coordinate and a Y-coordinate of the corresponding point are specified and recorded, and then the processing is ended (process S45). In this case, the processing then proceeds to the process S14 (see FIG. 10). In the process S15, it is determined, based on the X-coordinate and the Y-coordinate recorded in the process S45, whether the protrusion exists at the same point on two sheets of lower wafers W2 consecutively.

In the third example, the above-described series of processes are performed. According to the third example, since the focus adjustment is not required before and during the observation, a time required for the series of processes can be further shortened. Furthermore, the lower wafer W2 need not have patterns for focus adjustment.

Further, by scanning the entire top surface, as depicted in FIG. 16, high-accuracy foreign substance inspection can be carried out. Further, if the most recent processing in which the bonding processing is performed is a processing, such as chemical mechanical polishing, in which positions to which the foreign substances easily adhere are concentrated at the peripheral portion of the wafer, scanning the peripheral portion as shown in FIG. 17 may be enough. By scanning only the peripheral portion, the time required to complete the series of processes can be further reduced. By way of example, a scanning target upon the peripheral portion may be a region ranging from 30 mm from an edge of the wafer.

Further, in the bonding processing of the wafers, a size of an allowable foreign substance may differ depending on the electronic circuit formed on the wafer. In case of scanning the entire top surface as shown in FIG. 16, scanning pitches P and P' may be varied based on the size of the allowable foreign substance. To elaborate, if the allowable foreign substance is comparatively large, the protrusion can be detected even if the scanning pitch P is enlarged as compared to a case where the allowable foreign substance is small. By enlarging the scanning pitches P and P', presence or absence of the protrusion can be determined, and the time required for the series of processes can be reduced.

In addition, the reference for the determination of the presence or absence of the protrusion in the process S44 is not limited to the above-described example. By way of example, if there is a point where the Z-coordinate is maximum, it may be possible to make a determination upon whether a difference between this maximum Z-coordinate and a Z-coordinate of a nearby point where the Z-coordinate is minimum is equal to or larger than a threshold value Zth. Further, for this point, it may be possible to determine whether a gradient of the variation of the Z-coordinate between the point where the Z-coordinate is maximum and the point where the Z-coordinate is minimum is equal to or larger than a preset threshold value Sth.

In the first example, the second example and the third example, the foreign substance inspection using the upper imaging device 151A and the foreign substance inspection using the upper displacement meter 151B may be combined.

A frequency of the foreign substance inspection is not particularly limited. For example, the foreign substance inspection may be performed whenever the lower wafer W2 is carried in, whenever a preset number of combined wafers T are processed, or before a first lower wafer W2 of each lot is carried in. Furthermore, the foreign substance inspection may be performed whenever the preset number of combined wafers T are processed and, also, before the first lower wafer W2 of each lot is carried in. Further, the foreign substance inspection may be performed at any required time.

In the flowchart shown in FIG. 10, the processing is stopped when the foreign substance is detected at the same position on the two sheets of lower wafers W consecutively. However, the processing may be stopped when the foreign substance is detected at the same position on three or more lower wafers W2 consecutively. Furthermore, the processing may be stopped when the foreign substance is detected at a single sheet of lower wafer W2.

When taking out the lower wafer W2 in the process S14, the upper wafer W1 attracted to and held by the upper chuck 140 may be taken out along with the lower wafer W2. In this case, the transfer (process S103) and the attracting/holding (process S104) of another upper wafer W1 may be performed in the process S17.

An automatic cleaning device such as a cleaning pad for the lower chuck 141 may be embedded in the bonding apparatus 41, and the foreign substance on the top surface of the lower chuck 141 may be removed by driving the automatic cleaning device instead of stopping the processing in the process S16. In case of removing the foreign substance by using the automatic cleaning device, the lower wafer W2 taken out in the process S14 may be used as the another lower wafer W2 in the process S17.

If a determination on the processing stop is made in a certain foreign substance inspection, there is a likelihood that the foreign substance may adhere to combined wafers T which are manufactured during a period until the corresponding foreign substance inspection after the most recent foreign substance inspection, and these combined wafers T may be soft-marked. This information may be stored in the host computer which manages characteristics of the combined wafer T.

When determining whether to carry on or stop the processing, not only the size of the protrusion on the lower wafer W2 but also the position where the protrusion exists may be considered. By way of example, assume that a multiple number of semiconductor chips are diced from the lower wafer W2. If the protrusion occurs at the center of the lower wafer W2, the void may affect multiple semiconductor chips within an XY plane in all directions with respect to the protrusion. Meanwhile, if the protrusion occurs near the edge of the lower wafer W2, the number of semiconductor chips which are affected by the void, if any, may be small at the edge portion of the lower wafer W2. In this way, a yield differs depending on the position of the protrusion. Further, even if the number of high-quality semiconductor chips obtained from a single sheet of combined wafer T is reduced to a certain extent, it may be desirable, in the interests of time, to perform the cleaning of the lower chuck 141 after the bonding processing for the rest of wafers accommodated in the bonding system 1 is completed. Accordingly, by assigning a weight to each of the size of the protrusion and the position of the protrusion, for example, the determination upon whether to carry on or stop the processing may be made in consideration of all of these factors. In this case, the number of remaining wafers accommodated in the bonding system 1 may be additionally considered.

As the lower wafer W2 attracted to and held on the lower chuck 141 in the foreign substance inspection, a dummy wafer which is not used in the manufacture of a real product may be used. Particularly, if the displacement meter is used, it is desirable that a dummy wafer having uniform color on the entire surface thereof is used as the lower wafer W2. Since the surface color of the dummy wafer is uniform on the entire surface thereof, it is possible to detect presence or absence of the protrusion accurately with the displacement meter. Further, in this case, it is desirable to provide the dummy wafer within the bonding system 1.

According to the exemplary embodiment, the foreign substance adhering to the chuck can be detected appropriately.

So far, the exemplary embodiments or the like have been described in detail. However, the exemplary embodiments are not limiting, and various changes and modifications may be made without departing from the scope of the present disclosure as claimed in the following claims.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a chuck configured to attract and hold a substrate;
an observer configured to observe multiple positions within a second surface of the substrate attracted to and held by the chuck, the second surface being opposite to a first surface thereof which is in contact with the chuck;
an analyzer configured to analyze observation results of the multiple positions; and
a control device configured to control a processing of the substrate processing apparatus,
wherein when a singularity regarding a height from a surface of the chuck attracting and holding the substrate exists on the second surface, the analyzer specifies a position of the singularity on the chuck,
wherein the control device is further configured to stop the processing when the singularity is detected at a first position of the multiple positions of the substrate and another singularity is detected at a second position of multiple positions of another substrate, wherein the first position is same as the second position, and said another substrate and the substrate are consecutively attracted to the chuck.

2. The substrate processing apparatus of claim 1, wherein the singularity is a protrusion on the substrate.

3. The substrate processing apparatus of claim 1, wherein the observer comprises an imaging device configured to image a pattern formed on the second surface, and
the analyzer determines presence or absence of the singularity based on a distance to the second surface which is focused by the imaging device.

4. The substrate processing apparatus of claim 1, wherein the observer comprises a displacement meter configured to measure a distance from the observer to the second surface, and
the analyzer determines presence or absence of the singularity based on the distance measured by the displacement meter.

5. The substrate processing apparatus of claim 4, further comprising:
a position adjuster configured to move the displacement meter in a horizontal direction,
wherein the analyzer records the distance while scanning an entire top surface of the substrate or scanning a peripheral portion of the substrate by the position adjuster, and specifies a coordinate of the singularity in the horizontal direction based on the recorded distance.

6. The substrate processing apparatus of claim 5, wherein the substrate is a dummy wafer having uniform color over the entire surface thereof.

7. A substrate processing method, comprising:
attracting and holding a substrate by a chuck;
observing multiple positions within a second surface of the substrate attracted to and held by the chuck, the second surface being opposite to a first surface thereof which is in contact with the chuck;
analyzing observation results of the multiple positions;
specifying a position of a singularity on the chuck when the singularity regarding a height from a surface of the chuck attracting and holding the substrate exists on the second surface; and
controlling a processing of the substrate and stopping the processing when the singularity is detected at a first position of the multiple positions of the substrate and another singularity is detected at a second position of multiple positions of another substrate, wherein the first position is same as the second position, and said another substrate and the substrate are consecutively attracted to the chuck.

8. A bonding method, comprising:
attracting and holding a lower substrate by, between a lower chuck and an upper chuck disposed to be distance apart from each other in a vertical direction, an attraction surface of the lower chuck facing the upper chuck, and attracting and holding an upper substrate by an attraction surface of the upper chuck facing the lower chuck;
observing multiple positions within a second surface of the lower substrate attracted to and held by the lower chuck, the second surface being opposite to a first surface thereof which is in contact with the lower chuck;
analyzing observation results of the multiple positions;
performing position adjustment between the lower substrate attracted to and held by the lower chuck and the upper substrate attracted to and held by the upper chuck by moving the lower chuck and the upper chuck relatively to each other; and
bonding the lower substrate and the upper substrate by pressing, after the performing of the position adjustment, the lower substrate attracted to and held by the lower chuck and the upper substrate attracted to and held by the upper chuck to be brought into contact with each other,
wherein the analyzing of the observation results includes specifying a position of a singularity on the lower chuck when the singularity regarding a height from a surface of the lower chuck attracting and holding the lower substrate exists on the second surface, and controlling the bonding of the lower substrate and the upper substrate and stopping the bonding when the singularity is detected at a first position of the multiple positions of the lower substrate and another singularity is detected at a second position of multiple positions of another lower substrate, wherein the first position is same as the second position, and said another lower substrate and the lower substrate are consecutively attracted to the lower chuck.

9. The bonding method of claim 8, further comprising:
cleaning the lower chuck, before the performing of the position adjustment, depending on a size of the singularity.

10. The bonding method of claim 8, further comprising:

cleaning the lower chuck, before the performing of the position adjustment, depending on a size and a position of the singularity.

* * * * *